United States Patent
Okami

(10) Patent No.: US 12,297,528 B2
(45) Date of Patent: May 13, 2025

(54) OPTICAL FILM, SPUTTERING TARGET, AND METHOD OF PRODUCING OPTICAL FILM

(71) Applicant: SUMITOMO METAL MINING CO., LTD, Tokyo (JP)

(72) Inventor: Hideharu Okami, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 604 days.

(21) Appl. No.: 17/635,337

(22) PCT Filed: Jun. 24, 2020

(86) PCT No.: PCT/JP2020/024833
§ 371 (c)(1),
(2) Date: Feb. 14, 2022

(87) PCT Pub. No.: WO2021/033425
PCT Pub. Date: Feb. 25, 2021

(65) Prior Publication Data
US 2022/0316049 A1    Oct. 6, 2022

(30) Foreign Application Priority Data
Aug. 22, 2019 (JP) ................ 2019-151927

(51) Int. Cl.
*G02B 5/20* (2006.01)
*C03C 17/245* (2006.01)
(Continued)

(52) U.S. Cl.
CPC ........ *C23C 14/3414* (2013.01); *C03C 17/245* (2013.01); *C03C 17/3417* (2013.01);
(Continued)

(58) Field of Classification Search
CPC . G02B 1/00; G02B 1/045; G02B 1/10; G02B 1/11; G02B 1/111; G02B 1/113;
(Continued)

(56) References Cited

U.S. PATENT DOCUMENTS

2002/0015824 A1    2/2002    Kawamoto
2006/0178254 A1    8/2006    Takeda
(Continued)

FOREIGN PATENT DOCUMENTS

JP    H05-113085 A    5/1993
JP    2002-020142 A    1/2002
(Continued)

*Primary Examiner* — Thong Q Nguyen
(74) *Attorney, Agent, or Firm* — Kratz, Quintos & Hanson, LLP

(57) ABSTRACT

Provided is an optical film (composite tungsten oxide film containing cesium, tungsten, and oxygen), a sputtering target, and a method of producing an optical film by which film formation conditions can be easily obtained. An optical film of the present invention has transmissivity in a visible wavelength band, has absorbance in a near-infrared wavelength band, and has radio wave transparency, characterized in that the optical film comprises cesium, tungsten, and oxygen, and a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within specified numerical ranges.

15 Claims, 9 Drawing Sheets

(51) Int. Cl.
*C03C 17/34* (2006.01)
*C23C 14/00* (2006.01)
*C23C 14/08* (2006.01)
*C23C 14/34* (2006.01)
*C23C 14/35* (2006.01)
*C23C 14/54* (2006.01)
*H01J 37/34* (2006.01)
*C23C 4/08* (2016.01)
*C23C 4/134* (2016.01)

(52) U.S. Cl.
CPC ....... *C23C 14/0042* (2013.01); *C23C 14/0094* (2013.01); *C23C 14/083* (2013.01); *C23C 14/352* (2013.01); *C23C 14/548* (2013.01); *G02B 5/208* (2013.01); *H01J 37/3423* (2013.01); *H01J 37/3429* (2013.01); *H01J 37/3464* (2013.01); *C03C 2217/228* (2013.01); *C03C 2218/155* (2013.01); *C03C 2218/156* (2013.01); *C23C 4/08* (2013.01); *C23C 4/134* (2016.01); *H01J 2237/332* (2013.01)

(58) Field of Classification Search
CPC ......... G02B 1/115; G02B 1/116; G02B 1/118; G02B 1/16; G02B 1/18; G02B 5/00; G02B 5/003; G02B 5/0268; G02B 5/0273; G02B 5/0278; G02B 5/0284; G02B 5/0289; G02B 5/0294; G02B 5/08; G02B 5/0808; G02B 5/0816; G02B 5/0825; G02B 5/0833; G02B 5/0841; G02B 5/085; G02B 5/0858; G02B 5/0875; C03C 17/245; C03C 17/3417; C23C 14/0042; C23C 14/0094; C23C 14/083; C23C 14/3414; C23C 14/352; C23C 14/548; H01J 37/3423; H01J 37/3429; H01J 37/3464
USPC .................................. 359/350–361, 577–598
See application file for complete search history.

(56) References Cited

U.S. PATENT DOCUMENTS

2021/0238727 A1\* 8/2021 Sato .................... C23C 14/5846
2024/0166555 A1\* 5/2024 Okami ................... G02B 5/208

FOREIGN PATENT DOCUMENTS

JP 4096205 B2 6/2008
JP 6540859 B1 11/2019

\* cited by examiner

OPTICAL FILM, SPUTTERING TARGET, AND METHOD OF PRODUCING OPTICAL FILM

TECHNICAL FIELD

The present invention relates to an optical film having transmissivity in a visible wavelength band, having absorbance in a near-infrared wavelength band, and having radio wave transparency, and a method of producing the same, and particularly to an optical film formed by a sputtering method, a sputtering target, and a method of producing an optical film.

BACKGROUND ART

In these years, in order to reduce the amounts of energy consumed by air conditioners inside rooms or travel means such as cars in summer, development of the heat ray shielding technology for windows through which to take in outside light has been underway. As means for this technology, there are a method that attaches a film (light shielding member) in which a colored film or an optical thin film having a heat ray shielding effect is formed to a window, a method that applies a substance having a heat ray shielding effect to a window, a method that employs a window in which an optical thin film having a heat ray shielding effect is formed by evaporation, sputtering, or the like, and the like. The method that employs a window in which an optical thin film having a heat ray shielding effect is formed by evaporation, sputtering, or the like is a method that cannot apply an optical thin film to an existing window, but can form an optical thin film having high durability.

For example, as the above light shielding member such as a window member, Patent Literature 1 describes a film (light shielding member) having a mirror surface state in which a metal film of aluminum or the like is formed by an evaporation method. However, in a case where such a light shielding member is used, since the exterior appearance is in a half mirror form, reflected light is too bright in outdoor use, leading to a problem in terms of appearance. In addition, since a metal film of aluminum or the like has a high electrical conductivity, the metal film reflects radio waves, leading to a problem that it becomes difficult for devices which utilize radio waves such as cell phones, smartphones, and devices using GPS (Global Positioning System) to catch radio waves.

In addition, as the above method that applies a substance having a heat ray shielding effect, the present applicant has proposed an infrared ray shielding fine particle dispersed body containing composite tungsten oxide fine particles, which is described in Patent Literature 2. The composite tungsten oxide fine particles efficiently absorb rays of the sun, particularly light in the near-infrared region, and also have a high transparency to visible light. The above infrared ray shielding fine particle dispersed body is formed by dispersing the composite tungsten oxide fine particles into an appropriate solvent to obtain a dispersion liquid, adding a medium resin to the obtained dispersion liquid, and then coating a surface of a base material to form a thin film, and has both heat ray shielding ability and radio wave transparency. However, the method described in Patent Literature 2 has a problem that since the thin film is formed by the application (coating) method, a sophisticated application technique is required in order to secure the control of the film thickness, the uniformity in film thickness across a large area, and the flatness.

In addition, as the above method using sputtering or the like, Patent Literature 3 discloses a vehicle window glass and a method of producing the same, and proposes a vehicle window glass in which a first metal oxide film (ITO)/a first Ag film/a second metal oxide film (ITO)/a second Ag film/a third metal oxide film (ITO) are successively formed, for example, by using a large-scale in-line sputtering apparatus that is capable of treating a large-area substrate for a vehicle window glass. Patent Literature 4 proposes a composite tungsten oxide film obtained by sputtering film formation.

Meanwhile, in a case where a multi-layer film such as a first metal oxide film (ITO)/a first Ag film/a second metal oxide film (ITO)/a second Ag film/a third metal oxide film (ITO) or an optical film such as the above composite tungsten oxide film is formed using a sputtering apparatus, since the shape inside the film formation chamber of the sputtering apparatus to be used, the transfer speed of a glass substrate or the like, the positional relation among the gas emission pipe for an oxygen gas or the like to be introduced into the film formation chamber, the sputtering target, and the substrate, and the like complicatedly affect one another, it is difficult to primarily determine film formation conditions for a desired optical film. Hence, conventionally, a plurality of samples of a desired optical film are fabricated while film formation conditions are changed as appropriate based on theoretical calculations for the optical thin film, the transmittance in a visible wavelength band and the transmittance in a near-infrared wavelength band are measured for each one of the fabricated samples, and film formation conditions for the optical film suitable for the purpose are obtained for each sputtering apparatus to be used.

However, since the transmittance in a visible wavelength band and the transmittance in a near-infrared wavelength band are affected by the film thickness of an optical film, it is also necessary to conduct tests on whether the film thickness of a sample has an appropriate value. Therefore, the development of a method by which the film formation conditions for a desired optical film can be easily obtained has been desired.

CITATION LIST

Patent Literatures

Patent Literature 1: Japanese Patent Application Publication No. Hei 5-113085
Patent Literature 2: Japanese Patent No. 4096205
Patent Literature 3: Japanese Patent Application Publication No. 2002-020142
Patent Literature 4: Japanese Patent No. 6540859

SUMMARY OF INVENTION

Technical Problem

The present invention has been made in view of the above-described problems, and an object thereof is to provide an optical film (specifically, a composite tungsten oxide film containing cesium, tungsten, and oxygen) having the above-described properties (having transmissivity in a visible wavelength band, having absorbance in a near-infrared wavelength band, and having radio wave transparency) and for which film formation conditions of sputtering can be easily obtained, as well as a sputtering target and a method of producing an optical film.

Solution to Problem

In view of this, as a result of earnest studies on an optical film containing cesium, tungsten, and oxygen, the present inventor has consequently found that there are optimum optical constants (a refractive index and an extinction coefficient) for an optical film having the above-described properties (having transmissivity in a visible wavelength band, having absorbance in a near-infrared wavelength band, and having radio wave transparency), and confirmed that in a case where a fabricated optical film has the above-described optimum optical constants (a refractive index and an extinction coefficient), the optical film satisfies transmissivity in a visible wavelength band, absorbance in a near-infrared wavelength band, and radio wave transparency. Since the optical constants (a refractive index and an extinction coefficient) are not affected by a film thickness, the present inventor has found that it is possible to easily obtain film formation conditions for a desired optical film by measuring the optical constants (a refractive index and an extinction coefficient) with an ellipsometer without checking the film thickness of fabricated samples. The present invention has been completed based on such technical findings.

Specifically, a first aspect according to the present invention is an optical film having transmissivity in a visible wavelength band, having absorbance in a near-infrared wavelength band, and having radio wave transparency, characterized in that the optical film comprises cesium, tungsten, and oxygen, and a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of Table 1.

TABLE 1

| Wavelength (nm) | Refractive Index | Extinction Coefficient |
| --- | --- | --- |
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.8 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9 |

In addition, a second aspect is the optical film according to the first aspect, characterized in that the optical film comprises:

a compound of cesium, tungsten, and oxygen.

Next, a third aspect according to the present invention is a sputtering target used to form the optical film according to the first aspect or the second aspect by a sputtering method, characterized in that the sputtering target comprises:

a mixture of a compound of a cesium source and a compound of a tungsten source.

A fourth aspect is the sputtering target according to the third aspect, characterized in that a ratio between cesium atoms and tungsten atoms (Cs:W) is 1:2 to 1:4.

A fifth aspect is the sputtering target according to the third aspect or the fourth aspect, characterized in that the sputtering target comprises:

a thermally sprayed film of the cesium source and the tungsten source.

A sixth aspect is the sputtering target according to any one of the third aspect to the fifth aspect, characterized in that the compound of the cesium source is an oxide or a carbonate.

A seventh aspect is the sputtering target according to any one of the third aspect to the fifth aspect, characterized in that the compound of the tungsten source is an oxide or a carbide.

An eighth aspect is the sputtering target according to any one of the third aspect to the seventh aspect, characterized in that the sputtering target is a cylindrical rotary target.

Next, a ninth aspect according to the present invention is a method of producing an optical film having transmissivity in a visible wavelength band, having absorbance in a near-infrared wavelength band, and having radio wave transparency, the optical film comprising cesium, tungsten, and oxygen, in which a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of Table 2, characterized in that the method comprises:

forming the optical film by a sputtering method using the sputtering target according to any one of the third aspect to the eighth aspect and feedback-controlling an oxygen partial pressure of a sputtering film formation atmosphere.

TABLE 2

| Wavelength (nm) | Refractive Index | Extinction Coefficient |
| --- | --- | --- |
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.8 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |

TABLE 2-continued

| Wavelength (nm) | Refractive Index | Extinction Coefficient |
|---|---|---|
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9 |

A tenth aspect is the method of producing an optical film according to the ninth aspect, characterized in that the feedback control of the oxygen partial pressure is performed using an impedance controller which feedback-controls an impedance change during film formation.

An eleventh aspect is the method of producing an optical film according to the ninth aspect, characterized in that the feedback control of the oxygen partial pressure is performed using a plasma emission monitor which feedback-controls the oxygen partial pressure by measuring an emission intensity at a specific wavelength during film formation.

In addition, a twelfth aspect according to the present invention is a method of producing an optical film having transmissivity in a visible wavelength band, having absorbance in a near-infrared wavelength band, and having radio wave transparency, the optical film comprising cesium, tungsten, and oxygen, in which a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of Table 3, characterized in that the method comprises:

forming the optical film by a dual-sputtering method using a sputtering target of a cesium source and a sputtering target of a tungsten source and feedback-controlling an oxygen partial pressure of a dual-sputtering film formation atmosphere.

TABLE 3

| Wavelength (nm) | Refractive Index | Extinction Coefficient |
|---|---|---|
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.8 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9 |

A thirteenth aspect is the method of producing an optical film according to the twelfth aspect, characterized in that the method comprises:

adjusting an electric power to be applied to a sputtering cathode or a duty ratio such that a ratio between cesium atoms and tungsten atoms (Cs:W) contained in the optical film becomes 1:2 to 1:4.

A fourteenth aspect is the method of producing an optical film according to the twelfth aspect, characterized in that the feedback control of the oxygen partial pressure is performed using an impedance controller which feedback-controls an impedance change during film formation.

A fifteenth aspect is the method of producing an optical film according to the twelfth aspect, characterized in that the feedback control of the oxygen partial pressure is performed using a plasma emission monitor which feedback-controls the oxygen partial pressure by measuring an emission intensity at a specific wavelength during film formation.

Advantageous Effects of Invention

The optical film according to the present invention comprises cesium, tungsten, and oxygen, and a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within the numerical ranges of Table 1 given above. For this reason, it is possible to determine film formation conditions of a sputtering apparatus based on the refractive index n and the extinction coefficient k of the optical film. Since the method of setting film formation conditions is simplified as compared with the conventional methods in which film formation conditions are set for each sputtering apparatus from transmittance in a visible wavelength band or transmittance in a near-infrared wavelength band, it becomes possible to stably produce an optical film having transmissivity in a visible wavelength band, having absorbance in a near-infrared wavelength band, and having radio wave transparency.

DESCRIPTION OF EMBODIMENTS

Figure 1:
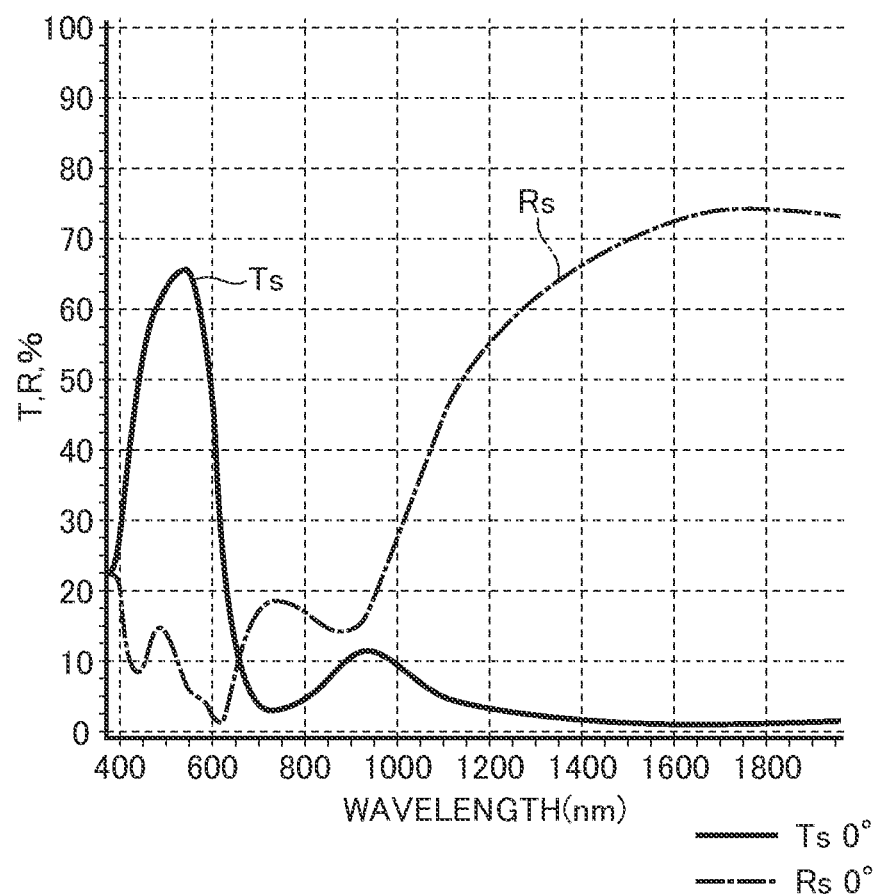
FIG. 1 is a graph showing spectro-optical properties (transmittance Ts and reflectance Rs) of an optical film made of a single-layer film according to Example 1.

Embodiments according to the present invention will be described in detail below.

The present invention uses a composite tungsten oxide film comprising cesium, tungsten, and oxygen and having a heat ray shielding effect, and makes it possible to significantly reduce the number of film layers as compared with a case of using a dielectric multi-layer film that is transparent in a visible wavelength band to a near-infrared wavelength band.

(1) Optical Film

An optical film according to the present invention comprises cesium, tungsten, and oxygen. The technique relating to infrared shielding using composite tungsten oxide particles according to the present applicant is described in detail in Patent Literature 2, and it is necessary to use a composite tungsten oxide in this composition range as a main component in order to obtain a film that has high transparency in the visible wavelength band and absorbance in the near-infrared wavelength band. The fundamental optical properties that a composite tungsten oxide film has are derived from the atomic arrangement of a theoretically calculated element M (M is at least one element selected from H, He, alkali metals, alkaline earth metals, rare earth elements, Mg, Zr, Cr, Mn, Fe, Ru, Co, Rh, Ir, Ni, Pd, Pt, Cu, Ag, Au, Zn, Cd, Al, Ga, In, Ti, Si, Ge, Sn, Pb, Sb, B, F, P, S, Se, Br, Te, Ti, Nb, V, Mo, Ta, Re, Be, Hf, Os, Bi, and I) and tungsten W and oxygen O. Specifically, in a case where composite tungsten oxide fine particles have a hexagonal crystal structure, the transmission in the visible light region of the fine particles is improved and absorption in the near-infrared region of the fine particles is improved. The composite tungsten oxide fine particles may be crystalline or amorphous.

In a case where composite tungsten oxide fine particles that have a hexagonal crystal structure have a uniform crystal structure, the amount of the additional element M to be added is preferably 0.2 or more and 0.5 or less, and more preferably 0.33, when the amount of tungsten is deemed as 1. It is considered that when the composite tungsten oxide is $M_{0.33}WO_3$, the additional elements M are arranged in all the voids of the hexagon.

Meanwhile, it suffices that the optical film according to the present invention comprises cesium (alkali metal), tungsten, and oxygen, and a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of Table 4 given below.

TABLE 4

| Wavelength (nm) | Refractive Index | Extinction Coefficient |
|---|---|---|
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.0 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9 |

Then, it is also possible to make an optical film made of a single-layer film comprising cesium, tungsten, and oxygen and having a film thickness of 200 nm in which the refractive index n and the extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within the numerical ranges of Table 4 given above have transmittance (Ts) and reflectance (Rs) shown in a graph of FIG. 1 for spectro-optical properties as well as radio wave transparency [a sheet resistance of $10^5$ Ω/□ (ohms per square) or more].

(2) Sputtering Target

The optical film comprising cesium, tungsten, and oxygen wherein the refractive index n and the extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within the numerical ranges of Table 4 given above needs to have a ratio between cesium atoms and tungsten atoms (Cs:W) set within a specific range and can be formed by a sputtering method. Then, the sputtering target used in the film formation includes a target containing cesium atoms and tungsten atoms (that is, a target containing a mixture of a compound of a cesium source and a compound of a tungsten source), or may be targets of a cesium source and a tungsten source made separately (that is, a sputtering target of a cesium source and a sputtering target of a tungsten source).

Hereinafter, sputtering film formation using a target containing cesium atoms and tungsten atoms is described.

In order to obtain an optical film wherein a refractive index n and a extinction coefficient k of the optical film are set respectively within the numerical ranges of Table 4 given above, a sputtering target of which the ratio between cesium atoms and tungsten atoms (Cs:W) is set within a range of 1:2 to 1:4 may be used. The ratio (Cs:W) is preferably 1:2.5 to 1:4, and most preferably 1:2.8 to 1:4. Then, the ratio between cesium atoms and tungsten atoms of the sputtering target substantially matches the ratio between cesium atoms and tungsten atoms of the optical film.

In addition, even when the target itself does not contain an appropriate amount of oxygen, it is possible to adjust the amount of oxygen to be taken into a film by means of a reactive sputtering. Moreover, the target may contain a component such as carbon that is discharged during sputtering.

As the cesium source, a metal, an oxide, or a carbonate may be used. Oxides of cesium include $Cs_2O$, $Cs_2O_2$, $CsO_2$, $Cs_2O_3$, $Cs_{11}O_3$, $Cs_4O$, and $Cs_7O$.

As the tungsten source, a metal, an oxide, or a carbide may be used. As an oxide of tungsten, $W_3O$, $WO_2$, $W_{20}O_{58}$, or $WO_3$ may be used.

Next, sputtering targets have a planar shape and a cylindrical shape. Although the planar target can be relatively easily produced, there is a case where the entire surface is not sputtered, foreign matters are deposited in a non-erosion portion which has not been sputtered, and these foreign matters cause abnormal discharge. Moreover, these foreign matters attach to the products in some cases. In these years, the cylindrical target (rotary target) shown in FIG. 2 has become mainstream as a large-sized target. While the cylindrical target is difficult to produce, since the entire surface is sputtered, the cylindrical target does not have such a drawback as in the planar target, and further can achieve use efficiency nearly 3 times that of the planar target.

Figure 2:
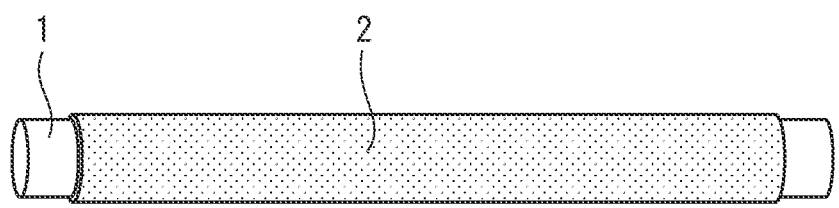
FIG. 2 is a schematic perspective view of cylindrical rotary targets according to the present invention.

The cylindrical target (rotary target) 2 shown in FIG. 2 is produced mainly by two methods.

The first method is a method including: producing a molded body through pressurization and molding by a cold isostatic pressing method, like the planar target, and sintering and grinding the obtained molded body into a cylinder, and inserting the resultant to a backing tube 1 shown in FIG. 2, followed by bonding with indium or the like.

The second method is a method including: thermally spraying a powder directly onto the backing tube 1.

The cylindrical target (rotary target) produced by thermal spraying is produced by forming a foundation layer made of an alloy selected from a nickel-aluminum alloy, a nickel-chromium alloy, a copper-aluminum alloy, a copper-zinc alloy, and the like by thermal spraying on the backing tube 1 made of a metal such as copper or a copper alloy and having a surface roughened by blasting, thermally spraying powders (a powder of a cesium source and a powder of a tungsten source) directly to form a thermally sprayed film (target film) having a thickness of 5 mm to 20 mm, and thereafter polishing the thermally sprayed film (target film) and finishing into a rotary target.

Here, as the thermal spraying, a plasma spraying may be used, and an AC/DC arc plasma torch, an inductive coupling plasma torch, or the like is used, and as the atmosphere during the thermal spraying, an inert gas or the like may be used.

Here, in a case where a sputtering target is produced by the thermal spraying method, it must be noted that $Cs_2O$ of the cesium source is sometimes disproportionally reacted to $Cs_2O_2$ depending on the temperature, which affects the sputtering rate of the obtained target (variation in sputtering rate).

(3) Sputtering Apparatus

By conducting reactive sputtering with oxygen using the above target, an optical film made of $Cs\alpha W\beta O\gamma C\delta$ can be obtained. α and β reflect the target composition ratio as it is, and γ can be adjusted by means of the amount of oxygen to be introduced during the reactive sputtering. Carbon C (for example, in a case where the tungsten source is made of carbide) released from the target binds to oxygen O released from the target or oxygen O introduced for the reactive sputtering and is discharged as $CO_2$, and thus hardly remains in the optical film.

Figure 3:
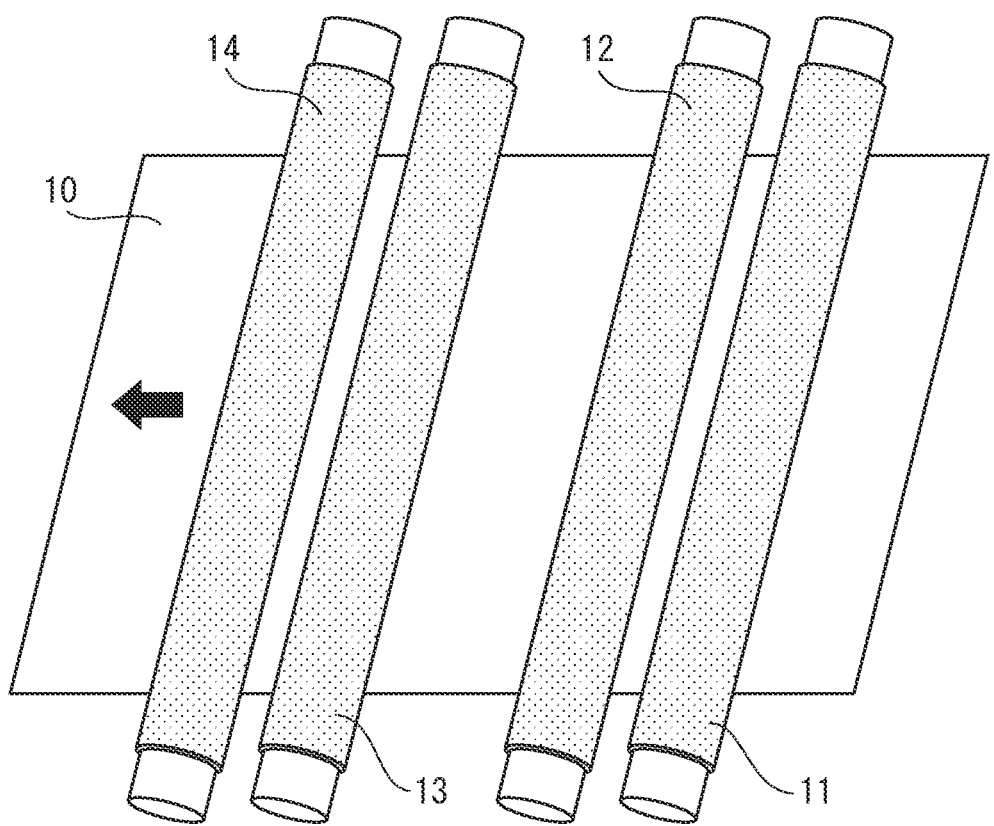
FIG. 3 is an explanatory diagram showing an arrangement relation between a glass substrate and rotary targets.

Note that for a non-conductive target, it is difficult to conduct sputtering utilizing a direct-current power supply. For this reason, a dual magnetron sputtering method is generally employed, which utilizes a medium-frequency power supply (20 kHz to 200 kHz) to alternately apply an electric power to two rotary targets 11, 12, 13, 14 arranged parallel to a substrate 10, which moves in the direction of the arrow as shown in FIG. 3. Moreover, a normal pulsed power supply and a high-voltage pulsed power supply (HiPMS) can also be utilized.

A sputtering apparatus using the dual magnetron sputtering method will be described below.

(3A) Sputtering Film Formation Unit A

Figure 4:
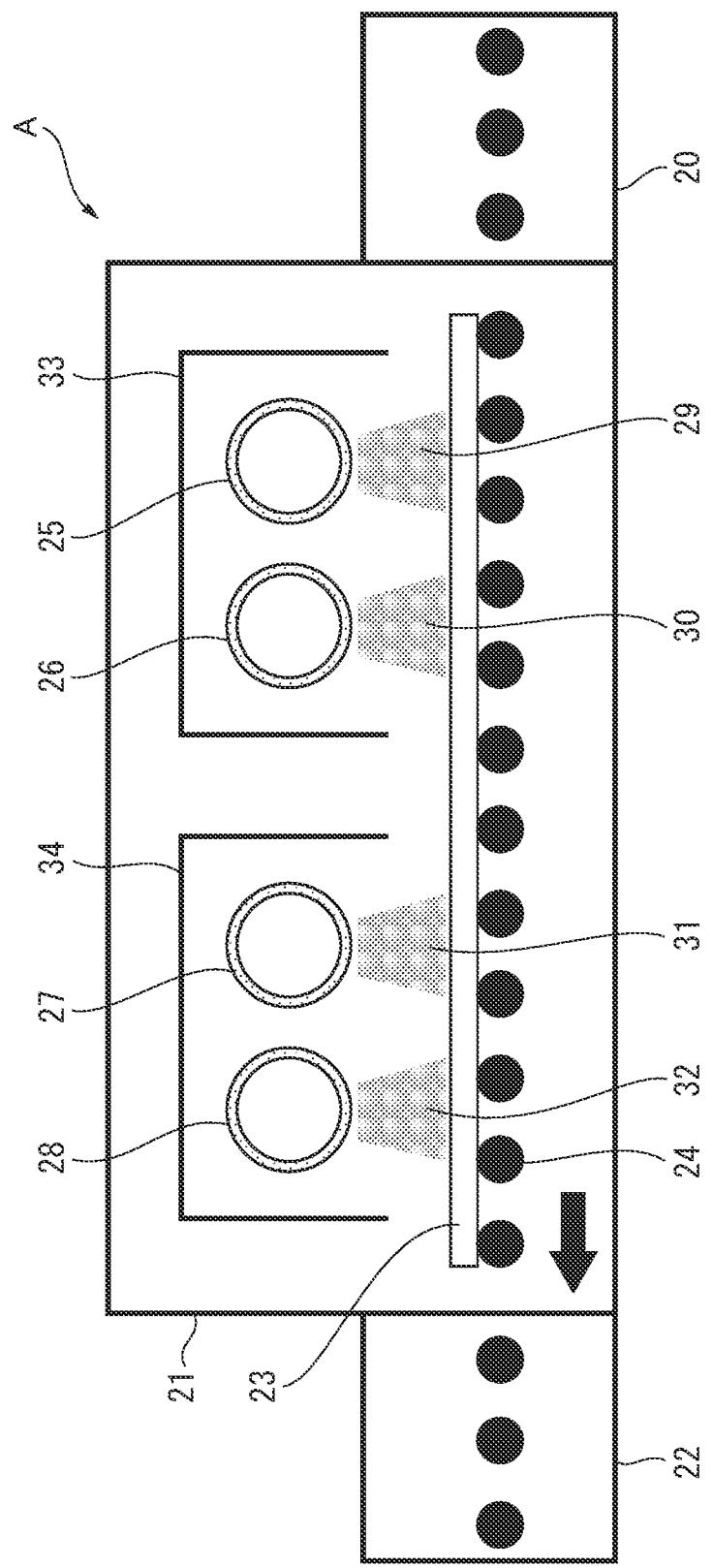
FIG. 4 is a configuration explanatory diagram of a sputtering film formation unit A according to the present invention.

The sputtering film formation unit A which forms a film by the dual magnetron sputtering method includes connection chambers 20, 22 and a film formation chamber 21 as shown in FIG. 4. Inside these connection chambers 20, 22 and film formation chamber 21, transfer rollers 24 which transfer the substrate 23 are successively arranged. Inside the film formation chamber 21, dual magnetron cathode units 33, 34 which maintain film formation gas pressure are provided. Note that the substrate 23 is heated to around 500° C. in the connection chamber 20 in advance. In addition, in the dual magnetron cathode units 33, 34, rotary magnetron cathodes (not shown) are arranged to which pairs of rotary targets 25, 26, 27, 28 are respectively attached, and the rotary targets 25, 26 and the rotary targets 27, 28 are each connected to the medium-frequency power supply such that the electric power is alternately applied thereto. In addition, in the rotary magnetron cathodes, which are not shown, magnets (not shown) that cause sputtering regions 29, 30, 31, 32 to be generated only on the substrate 23 side of the rotary targets 25, 26, 27, 28 are arranged, which cause most of the target particles from the rotary targets 25, 26, 27, 28 to fly in the direction toward the substrate 23, so that the attachment efficiency is around 90%.

The oxygen gas for conducting the reactive sputtering is introduced into each of the dual magnetron cathode units 33, 34. To control the amount of oxygen to be introduced into the dual magnetron cathode units 33, 34, for example, an "impedance control" which controls the impedance change of the sputtering power supply to a set value, or a plasma emission monitor (PEM) control which controls a plasma emission intensity at a specific wavelength to a set value may be employed.

Then, the sputtering film formation unit A shown in FIG. 4 in which two pairs of dual magnetron cathode units 33, 34 are arranged in the film formation chamber 21 is capable of forming two types of optical films at maximum. In a case where the same rotary target is incorporated in each of the two pairs of dual magnetron cathode units 33, 34, it becomes possible to form one type of optical film in two-fold film thickness.

Next, in the film forming method in accordance with the dual-sputtering method, a sputtering target that serves as the cesium source and a sputtering target that serves as the tungsten source are prepared, and the respective sputtering targets are attached to different rotary magnetron cathodes to conduct sputtering.

A CsxWyOz film can be obtained by conducting the reactive sputtering with oxygen. For x and y, the sputtering rates of the sputtering target that serves as the cesium source and the sputtering target that serves as the tungsten source need to be adjusted.

There are several methods for adjusting the sputtering rates by attaching the sputtering target that serves as the cesium source and the sputtering target that serves as the tungsten source to different rotary magnetron cathodes.

(i) An adjustment method including: connecting individual pulsed power supplies to both rotary magnetron cathodes; and simultaneously applying sputtering electric powers having the same pulse time and different peak powers to both rotary magnetron cathodes.

(ii) An adjustment method including: connecting a single dual magnetron power supply to both rotary magnetron cathodes; and alternately applying sputtering electric powers having the same peak power and different duty ratios to both rotary magnetron cathodes.

(iii) It is possible to adjust both target composition ratios by the above method (i) or (ii).

In addition, z in the CsxWyOz film can be adjusted by means of the amount of oxygen to be introduced during the reactive sputtering.

Figure 5:
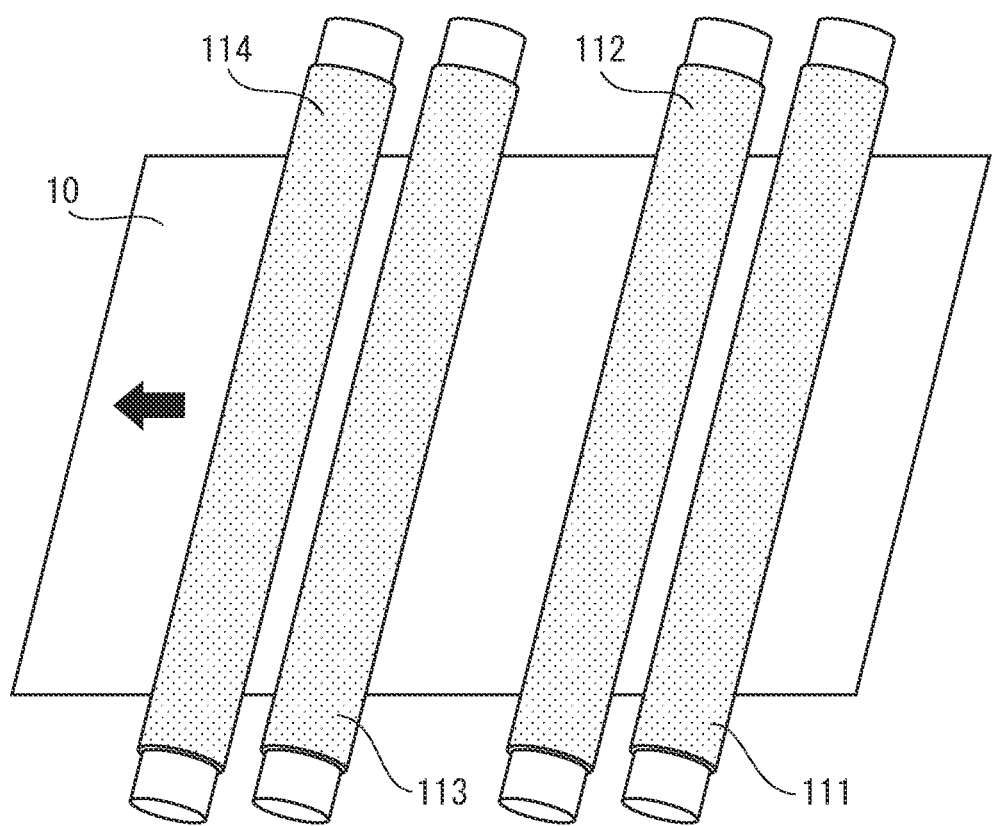
FIG. 5 is an explanatory diagram showing an arrangement relation between a glass substrate and rotary targets according to a dual-sputtering method.

Since for a non-conductive target, it is difficult to conduct sputtering utilizing a direct-current power supply as described above, the dual magnetron sputtering method is generally employed, which utilizes a medium-frequency power supply (20 kHz to 200 kHz) to alternately apply electric powers to targets 111, 113 containing a cesium source as a main component and targets 112, 114 containing a tungsten source as a main component, which are arranged parallel to the substrate 10, which moves in the direction of the arrow, as shown in FIG. 5. Moreover, the normal pulsed power supply and the high-voltage pulsed power supply (HiPMS) can be utilized.

(3B) Sputtering Film Formation Unit B

Figure 6:
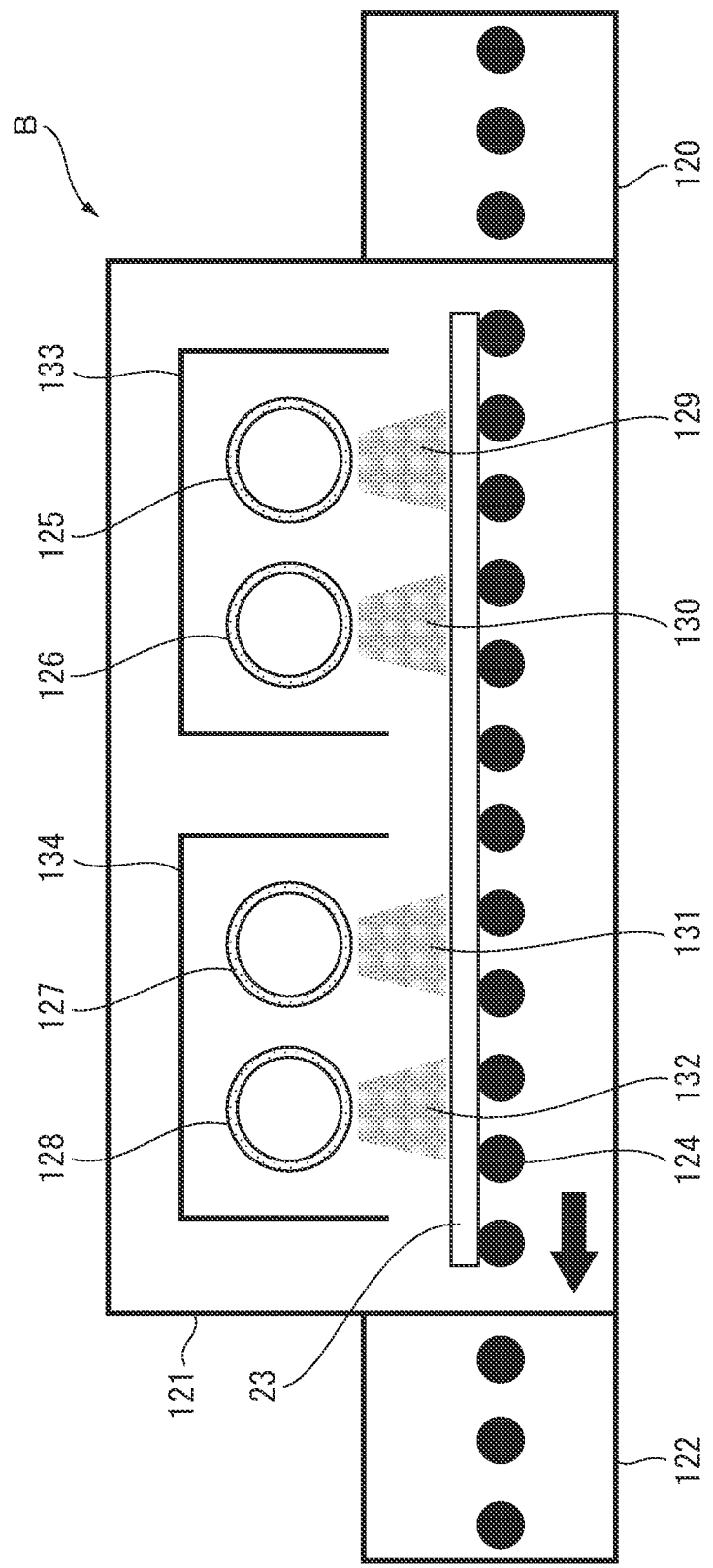
FIG. 6 is a configuration explanatory diagram of a sputtering film formation unit B according to the dual-sputtering method.

The sputtering film formation unit B which forms a film by the dual magnetron sputtering method includes connection chambers 120, 122 and a film formation chamber 121 as shown in FIG. 6. Inside these connection chambers 120, 122 and film formation chamber 121, transfer rollers 124 which transfer the substrate 23 are successively arranged. Inside the film formation chamber 121, dual magnetron cathode units 133, 134 which maintain film formation gas pressure are provided. Note that the substrate 23 is heated to around 500° C. in the connection chamber 120 in advance. In addition, in two pairs of the dual magnetron cathode units 133, 134, rotary magnetron cathodes (not shown) are arranged to which rotary targets 125, 127 containing a cesium source as a main component and rotary targets 126, 128 containing a tungsten source as a main component are respectively attached, and the rotary targets 125, 126 and the rotary targets 127, 128 are each connected to the medium-frequency power supply such that the electric power is alternately applied thereto. In addition, in the rotary magnetron cathodes, which are not shown, magnets (not shown) that cause sputtering regions 129, 130, 131, 132 to be generated only on the substrate 23 side of the rotary targets 125, 126, 127, 128 are arranged, which cause most of the target particles from the rotary targets 125, 126, 127, 128 to fly in the direction toward the substrate 23, so that the attachment efficiency is around 90%.

The oxygen gas for conducting the reactive sputtering is introduced into each of the dual magnetron cathode units 133, 134. To control the amount of oxygen to be introduced into the dual magnetron cathode units 133, 134, for example, an "impedance control" which controls the impedance change of the sputtering power supply to a set value, or a plasma emission monitor (PEM) control which controls the plasma emission intensity at a specific wavelength to a set value may be employed.

Then, the sputtering film formation unit B shown in FIG. 6 in which two pairs of dual magnetron cathode units 133, 134 are arranged in the film formation chamber 121 is capable of forming two types of optical films at maximum. In a case where the same rotary target is incorporated in each of the two pairs of dual magnetron cathode units 133, 134, it becomes possible to form one type of optical film in two-fold film thickness. However, in the cathode arrangement as shown in FIG. 6, a film formed of a cesium oxide as a main component and a film formed of a tungsten oxide as a main component are stacked one on another.

Figure 7:
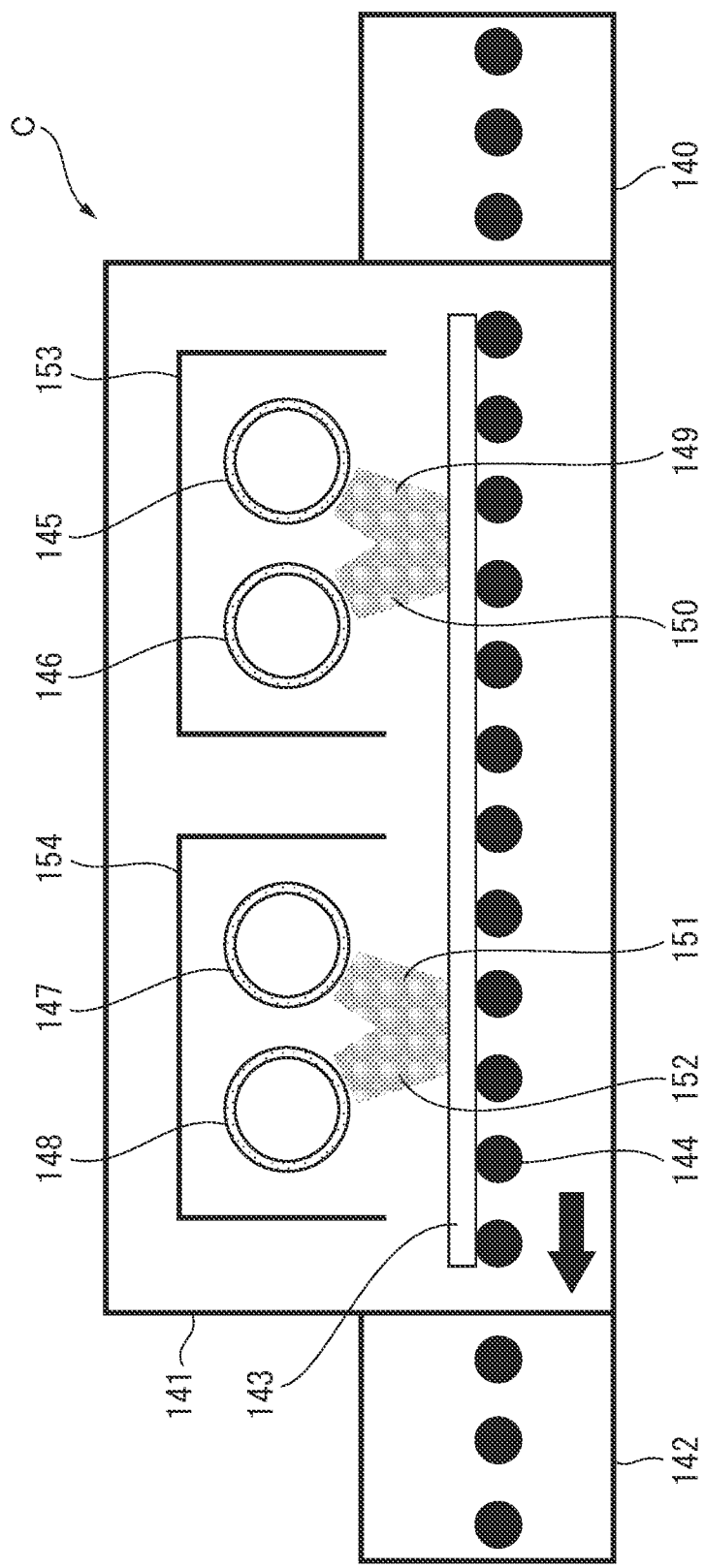
FIG. 7 is a configuration explanatory diagram of a sputtering film formation unit C according to the dual-sputtering method.

Meanwhile, in order to obtain an optical film in which the molar ratio between cesium and tungsten contained in the optical film is 1:2 to 1:4 by controlling the atmospheric oxygen partial pressure during film formation in the dual-sputtering method employing a rotary target containing a cesium source as a main component and a rotary target containing a tungsten source as a main component, magnet bars (not shown) inside the rotary magnetron cathodes may be arranged while inclined in a rotation direction as shown in FIG. 7 to overlap the sputtering film formation areas as shown in FIG. 7. Moreover, it is also possible to swing the magnet bars slightly in the rotation direction.

(3C) Sputtering Film Formation Unit C

The sputtering film formation unit C which forms a film such that sputtering film formation areas overlap, includes connection chambers 140, 142 and a film formation chamber 141 as shown in FIG. 7. Inside these connection chambers 140, 142 and film formation chamber 141, transfer rollers 144 which transfer the substrate 143 are successively arranged. Inside the film formation chamber 141, dual magnetron cathode units 153, 154 which maintain film formation gas pressure are provided. Note that the substrate 143 is heated to around 500° C. in the connection chamber 140 in advance. In addition, in two pairs of the dual magnetron cathode units 153, 154, rotary magnetron cathodes (not shown) are arranged to which rotary targets 145, 147 containing a cesium oxide powder as a main component and rotary targets 146, 148 containing a tungsten oxide powder as a main component are respectively attached, and the rotary targets 145, 146 and the rotary targets 147, 148 are each connected to the medium-frequency power supply such that the electric power is alternately applied thereto. In addition, in the rotary magnetron cathodes, which are not shown, magnets (not shown) that cause sputtering regions 149, 150, 151, 152 to be generated only on the substrate 143 side of the rotary targets 145, 146, 147, 148 are arranged, which cause most of the target particles from the rotary targets 145, 146, 147, 148 to fly in the direction toward the substrate 143, so that the attachment efficiency is around 90%.

The oxygen gas for conducting the reactive sputtering is introduced into each of the dual magnetron cathode units 153, 154. To control the amount of oxygen to be introduced into the dual magnetron cathode units 153, 154, for example, an "impedance control" which controls the impedance change of the sputtering power supply to a set value, or a plasma emission monitor (PEM) control which controls the plasma emission intensity at a specific wavelength to a set value may be employed.

Moreover, in the case of using the sputtering film formation unit C, regarding the proportion of cesium atoms and the proportion of tungsten atoms in one of the rotary targets arranged in the dual magnetron cathode units 153, 154, it is also possible to employ a blend that is shifted from the proportion of cesium atoms and the proportion of tungsten atoms of a target optical film, thereby making the other rotary target contain cesium or tungsten that runs short in the one rotary target. For example, it is also possible to make the rotary targets 145, 147 contain $Cs_2WO_4$ and to make the rotary targets 146, 148 contain a tungsten source.

(3D) Sputtering Apparatus for Optical Film Made of Multi-Layer Film

Figure 8:
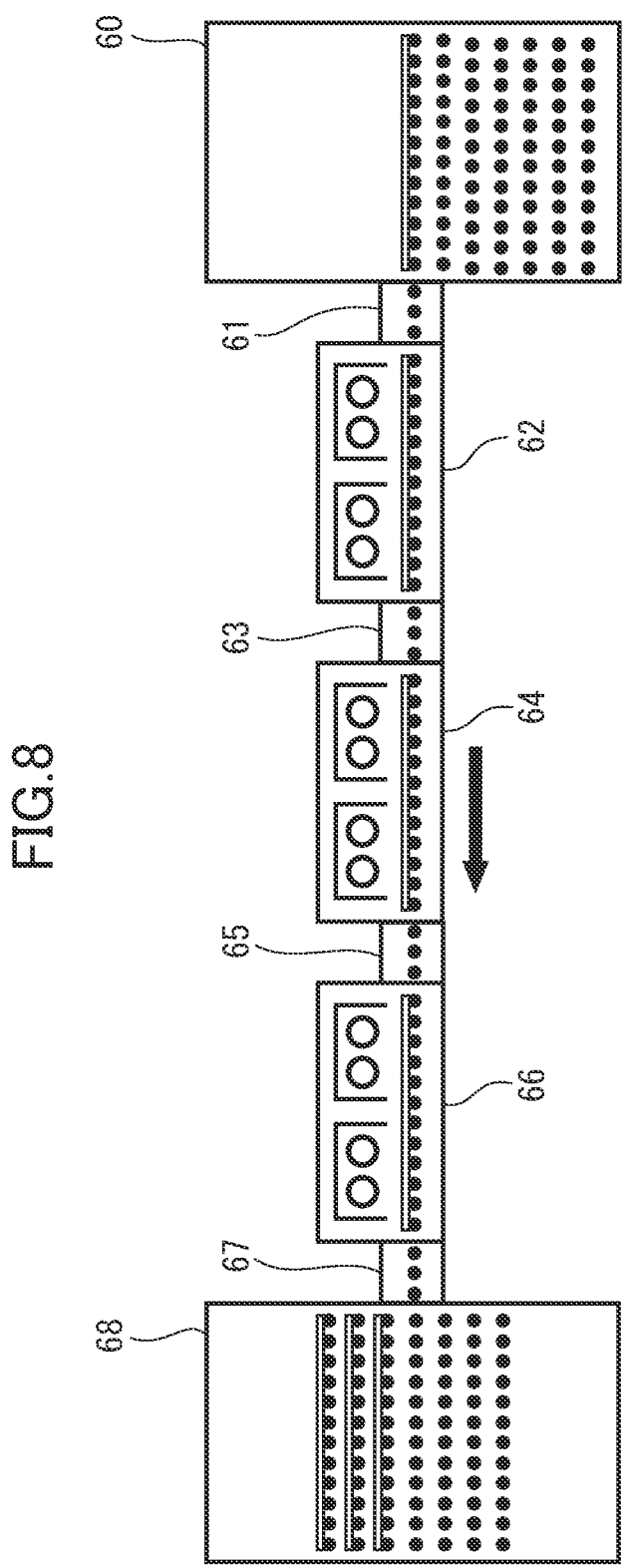
FIG. 8 is a configuration explanatory diagram of a sputtering apparatus which can form an optical film made of a multi-layer film.

In order to form a multi-layer film having more layers, the sputtering film formation unit A shown in FIG. 4, the sputtering film formation unit B shown in FIG. 6, or the sputtering film formation unit C shown in FIG. 7 may be arranged one after another as shown in FIG. 8. Sputtering film formation units 62, 64, 66 are connected by means of connection chambers 61, 63, 65, 67 between a substrate storage chamber 60 and a substrate storage chamber 68 as shown in FIG. 8. In the configuration shown in FIG. 8, it is possible to form 6 types of optical films at maximum, but the number of layers is not limited when reciprocating film formation (the substrate is transferred in the opposite direction after film formation) is conducted.

In order to enhance the transmissivity in a visible wavelength band, the spectro-optical properties (see the transmittance Ts and the reflectance Rs shown in FIG. 1 and FIG. 12) of the optical film made of a single-layer film have a slightly large reflection in a visible wavelength band. A large reflection is not favorable because a surrounding object is reflected.

In order to reduce reflection while maintaining the transmissivity in a visible wavelength band, a method that makes an optical film of a multi-layer film is effective.

A multi-layer film having the following film configuration was formed.
Substrate: soda-lime glass
First layer: $SiO_2$ having a thickness of 25 nm
Second layer: an oxide film containing Cs and W and having a thickness of 24 nm
Third layer: $SiO_2$ having a thickness of 10 nm
Fourth layer: an oxide film containing Cs and W and having a thickness of 228 nm
Fifth layer: $SiO_2$ having a thickness of 85 nm
Medium: air The spectro-optical properties (transmittance Ts and reflectance Rs) of the optical film made of the above multi-layer film are as shown in a graph of FIG. 9. It is observed from the graph of FIG. 9 that the reflectance in a visible wavelength band was reduced. The film configuration of the multi-layer film may be slightly modified by adjusting the number of film layers and the film thickness of each layer in accordance with the spectro-optical properties to be achieved.

The above $SiO_2$ film was formed by reactive sputtering based on the dual magnetron sputtering using a SiC rotary target.

Note that there is no limitation to the number of layers or film materials of the multi-layer film, and the multi-layer film may be formed on both surfaces of the substrate. The number of film layers and the film material that allow target spectroscopic properties to be achieved may be designed based on the theoretical calculation for the optical thin film.

It is possible to form one type of optical film with a pair of the dual magnetron cathode units. In a case where two pairs or more of the dual magnetron cathode units 33, 34 are incorporated in one film formation chamber 21 as shown in the sputtering film formation unit A in FIG. 4, there is no problem if there is no large difference in oxygen partial pressure during the formation of two types of optical films. However, if there is large difference in oxygen partial pressure, it is preferable to separate the film formation chambers as shown in FIG. 8. In addition, it is possible to form a multi-layer film that has no limitation in the number of film layers due to the film types of the number of dual magnetron cathode units or the number of film formation chambers by performing not one-way film formation but multiple times of reciprocating film formation.

EXAMPLES

Examples of the present invention will be described in detail below.

Example 1

A $Cs_2CO_3$ powder and a WC powder were employed as raw materials of a sputtering target, and the raw materials were mixed such that the ratio between cesium atoms contained in the $Cs_2CO_3$ powder and tungsten atoms contained in the WC powder (Cs:W) became 1:3.

Then, the mixture was deposited in a 1700 mm region at the center portion of a backing tube (see Reference sign 1 in FIG. 2) which was made of titanium and had an outer diameter of 160 mm and a length of 1800 mm by a thermal spraying method while the backing tube was being rotated to obtain a thermally sprayed film (target film) having a thickness of 10 mm, and thereafter the thermally sprayed film (target film) was polished to fabricate a rotary target. The thermally sprayed film (target film) of the rotary target thus obtained may have insufficient oxygen due to the thermal spraying method as compared with the mixture of the raw materials. However, this is not a problem because oxygen is supplied into the film during the sputtering film formation of the optical film by performing reactive sputtering with oxygen.

Four rotary targets were fabricated by the same thermal spraying method, and two of the rotary targets 25, 26, 27, 28 were incorporated in each of the dual magnetron cathode units 33, 34 of the sputtering film formation unit A shown in FIG. 4. Then, a 40 kHz mid-frequency sputtering power supply of 50 kW was connected to rotary magnetron cathodes, which are not shown, to which the rotary targets 25, 26, 27, 28 were attached.

Inside the dual magnetron cathode units 33, 34, oxygen, which was a reactive gas, was introduced in addition to argon, which was a sputtering gas. The amount of oxygen introduced was feedback-controlled with a piezo valve by measuring the impedance of the sputtering power supply such that the impedance became a set impedance.

Note that since the electric power W is obtained from the electric power W=I×I×R or the electric power W=V×V/R, the voltage or the current may be used as a parameter for control in place of the impedance. In addition, control using a plasma emission monitor (PEM) which measures a specific plasma emission wavelength intensity for feedback control can be applied in place of the impedance control.

In addition, the reason why the amount of oxygen is not directly control is as follows. Specifically, the reactive sputtering has the "metal mode", the "transition mode", and the "oxide mode", and high-speed film formation is possible in the "transition mode". This is because in this "transition mode", the film formation speed hops and does not stabilize if the above-described feedback control is not performed because the film formation rate is different between when the gas flow rate increases and when the gas flow rate decreases. That is, the "impedance control" is employed for the control on the amount of oxygen to be introduced into the dual magnetron cathode units 33, 34 as described above.

First, the film formation chamber and the substrate storage chamber were vacuum-exhausted to $5 \times 10^{-4}$ Pa or less, and then, an argon gas which was able to be mixed with oxygen was introduced at 800 sccm into the dual magnetron cathode units. The heater was adjusted such that the temperature of the glass substrate became 500° C. in the substrate storage chamber and the film formation chamber. As the heater, a near-infrared heater, a carbon heater, a sheath heater, or the like can be used.

Note that a 1400 mm-square soda-lime glass was used as the glass substrate.

40 kW was applied to the pair of rotary magnetron cathodes in the dual magnetron cathode units, and the transfer speed of the glass substrate was set to 1.0 m/min. Note that it is desirable to arrange a pre-treatment chamber in the substrate storage chamber and the film formation chamber to treat (clean or etch) the surface of the glass substrate using plasma, an ion beam, or the like in the pre-treatment chamber.

In order to fabricate samples of optical films for which oxygen to be mixed with argon was changed, samples of optical films were repeatedly fabricated with various set impedances, and the optical constants (refractive index and extinction coefficient) at a wavelength from 300 nm to 1700 nm were measured by the ellipsometry.

Figure 10:
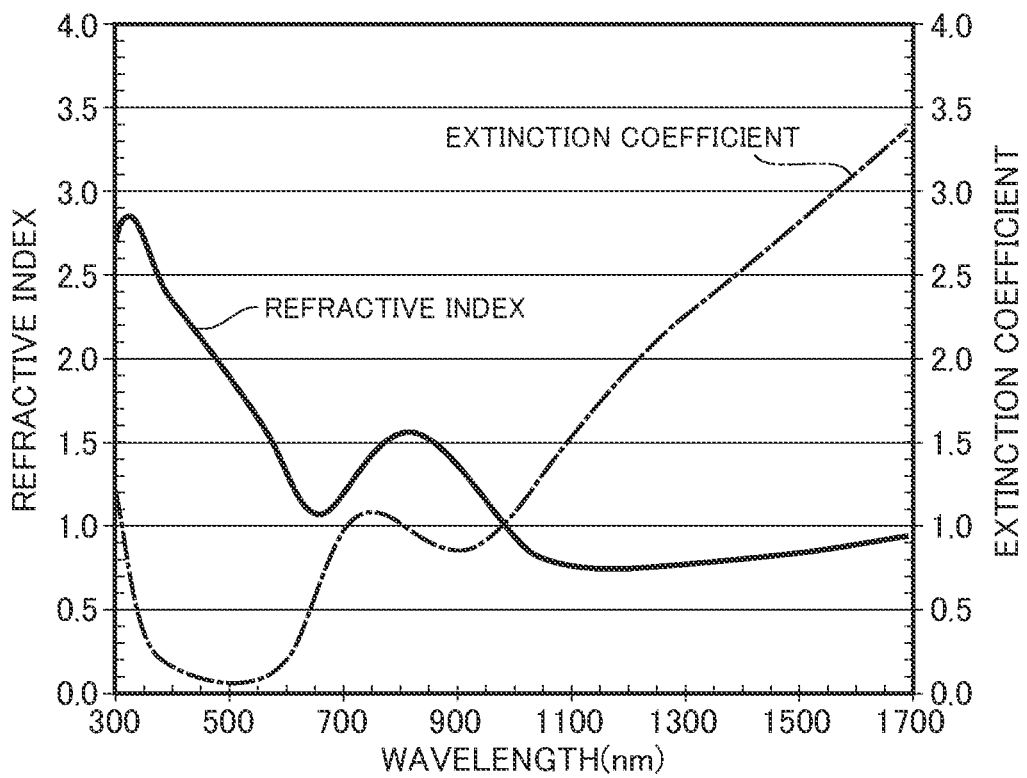
FIG. 10 is a wavelength dispersion graph of optical constants (refractive index and extinction coefficient) of the optical film made of a single-layer film according to Example 1.

Then, an oxide film (optical film) which contained Cs and W and had the optical constants (refractive index and extinction coefficient) as shown in FIG. 10 was formed with a thickness of 200 nm on a soda-lime glass to obtain Substrate: a soda-lime glass First layer: an oxide film containing Cs and W and having a thickness of 200 nm Medium: air. The spectro-optical properties (transmittance Ts and reflectance Rs) were as shown in FIG. 1.

Note that the refractive index n and the extinction coefficient k at each of wavelengths [300 nm, 350 nm, 400 nm, 450 nm, . . . , 1700 nm] specified at 50 nm intervals in a wavelength region from 300 nm to 1700 nm as described in Table 5 given below were obtained from a wavelength dispersion graph of optical constants (refractive index and extinction coefficient) of FIG. 10.

TABLE 5

| Wavelength (nm) | Refractive Index | Extinction Coefficient |
|---|---|---|
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |

TABLE 5-continued

| Wavelength (nm) | Refractive Index | Extinction Coefficient |
|---|---|---|
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.8 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9 |

Then, it was confirmed that the optical film according to Example 1, which was made of a single-layer film having a film thickness of 200 nm, had transmissivity in a visible wavelength band (the transmittance at a wavelength of 550 nm was 60% or more), had absorbance in a near-infrared wavelength band (the transmittance at a wavelength of 1200 nm was 10% or less), and also had radio wave transparency (sheet resistance: $10^6$ Ω/□).

Example 2

A $Cs_2O$ powder was employed as a raw material of a target containing a cesium oxide powder as a main component, and a $WO_3$ powder was employed as a raw material of a target containing a tungsten oxide powder as a main component.

First, the $Cs_2O$ powder was deposited in a 1700 mm region at the center portion of a backing tube (see Reference sign 1 in FIG. 2) which was made of titanium and had an outer diameter of 160 mm and a length of 1800 mm by the thermal spraying method while the backing tube was being rotated to obtain a $Cs_2O$ thermally sprayed film (target film) having a thickness of 10 mm, and thereafter the $Cs_2O$ thermally sprayed film (target film) was polished to fabricate a $Cs_2O$ rotary target. Note that two $Cs_2O$ rotary targets were fabricated.

Similarly, the $WO_3$ powder was deposited in the 1700 mm region at the center portion of the backing tube (see Reference sign 1 in FIG. 2) which was made of titanium and had an outer diameter of 160 mm and a length of 1800 mm by the thermal spraying method while the backing tube was being rotated to obtain a $WO_3$ thermally sprayed film (target film) having a thickness of 10 mm, and thereafter the $WO_3$ thermally sprayed film (target film) was polished to fabricate a $WO_3$ rotary target. Note that two $WO_3$ rotary targets were fabricated as well.

The thermally sprayed film (target film) of each rotary target thus obtained may have insufficient oxygen due to the thermal spraying method as compared with the mixture of raw materials. However, this is not a problem because oxygen is supplied into the film during the sputtering film formation of the optical film by performing reactive sputtering with oxygen.

Next, the $Cs_2O$ rotary target 145 and the $WO_3$ rotary target 146 were attached and incorporated in the rotary magnetron cathodes (not shown) in the dual magnetron cathode unit 153 of the sputtering film formation unit C shown in FIG. 7, and the Cs$_2$O rotary target 147 and the WO$_3$ rotary target 148 were attached and incorporated in the rotary magnetron cathodes (not shown) in the dual magnetron cathode unit 154. Then, a 40 kHz mid-frequency sputtering power supply of 50 kW was connected to the rotary magnetron cathodes, which are not shown, to which the rotary targets 145, 146, 147, 148 were attached. Note that the interval of the center line in the longitudinal direction of each of the rotary magnetron cathodes (not shown) to which the Cs$_2$O rotary target 145 and the WO$_3$ rotary target 146 were attached respectively in the dual magnetron cathode unit 153 is 200 mm, and the interval from this center line to the surface of the glass substrate is also 200 mm. In other words, the interval from the surface of the rotary target in the state of bland-new target to the surface of the substrate 143 is 110 mm. The magnet bars incorporated in the rotary magnetron cathodes (not shown) were set to be inclined respectively by +30° and −30° (0° immediately below) toward the substrate 143 immediately below the intermediate position in the above center line of the rotary magnetron cathodes.

Inside the dual magnetron cathode units 153, 154, oxygen, which was the reactive gas, was introduced in addition to argon, which was the sputtering gas. The amount of oxygen introduced was feedback-controlled with a piezo valve by measuring the impedance of the sputtering power supply such that the impedance became a set impedance.

Note that since the electric power W is obtained from the electric power W=I×I×R or the electric power W=V×V/R, the voltage or the current may be used as a parameter for control in place of the impedance. In addition, control using a plasma emission monitor (PEM) which measures a specific plasma emission wavelength intensity for feedback control can be applied in place of the impedance control.

In addition, the reason why the amount of oxygen is not directly control is the same as in Example 1. Specifically, the reactive sputtering has the "metal mode", the "transition mode", and the "oxide mode", and high-speed film formation is possible in the "transition mode". This is because in this "transition mode", the film formation speed hops and does not stabilize if the above-described feedback control is not performed because the film formation rate is different between when the gas flow rate increases and when the gas flow rate decreases. That is, the "impedance control" is employed for the control on the amount of oxygen to be introduced into the dual magnetron cathode units 153, 154 as described above.

Here, when the duty ratio in the 40 kHz mid-frequency sputtering power supply of 50 kW that applied electric power to the Cs$_2$O rotary target and the WO$_3$ rotary target was set to 1:3, the composition ratio between cesium and tungsten contained in the oxide film, which contained Cs and W, became 1:3.

First, the film formation chamber and the substrate storage chamber were vacuum-exhausted to 5×10$^{-4}$ Pa or less, and then, an argon gas which was able to be mixed with oxygen was introduced at 800 sccm into the dual magnetron cathode units. The heater was adjusted such that the temperature of the glass substrate became 500° C. in the substrate storage chamber and the film formation chamber. As the heater, a near-infrared heater, a carbon heater, a sheath heater, or the like can be used.

Note that a 1400 mm-square soda-lime glass was used as the glass substrate.

50 kW was applied to the pair of rotary magnetron cathodes in the dual magnetron cathode units, and the transfer speed of the glass substrate was set to 1.0 m/min. Note that it is desirable to arrange a pre-treatment chamber in the substrate storage chamber and the film formation chamber to treat (clean or etch) the surface of the glass substrate using plasma, an ion beam, or the like in the pre-treatment chamber.

In order to fabricate samples of optical films for which oxygen to be mixed with argon was changed, samples of optical films were repeatedly fabricated with various set impedances, and the optical constants (refractive index and extinction coefficient) at a wavelength from 300 nm to 1700 nm were measured by the ellipsometry.

Figure 11:
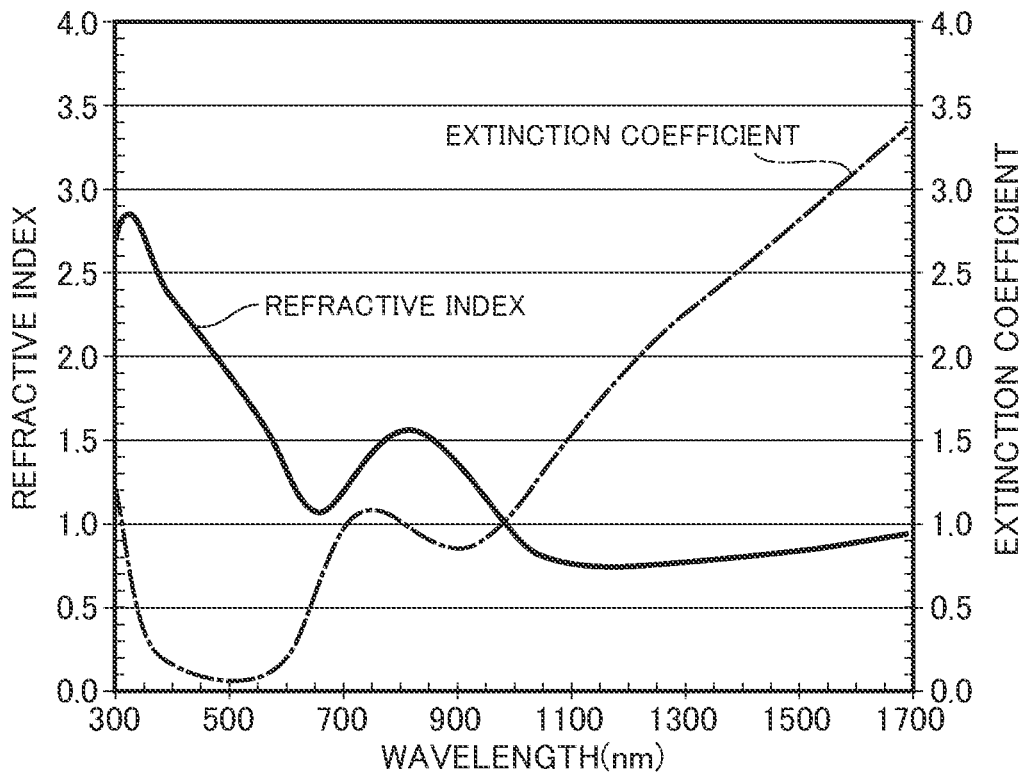
FIG. 11 is a wavelength dispersion graph of optical constants (refractive index and extinction coefficient) of an optical film made of a single-layer film according to Example 2.
Figure 12:
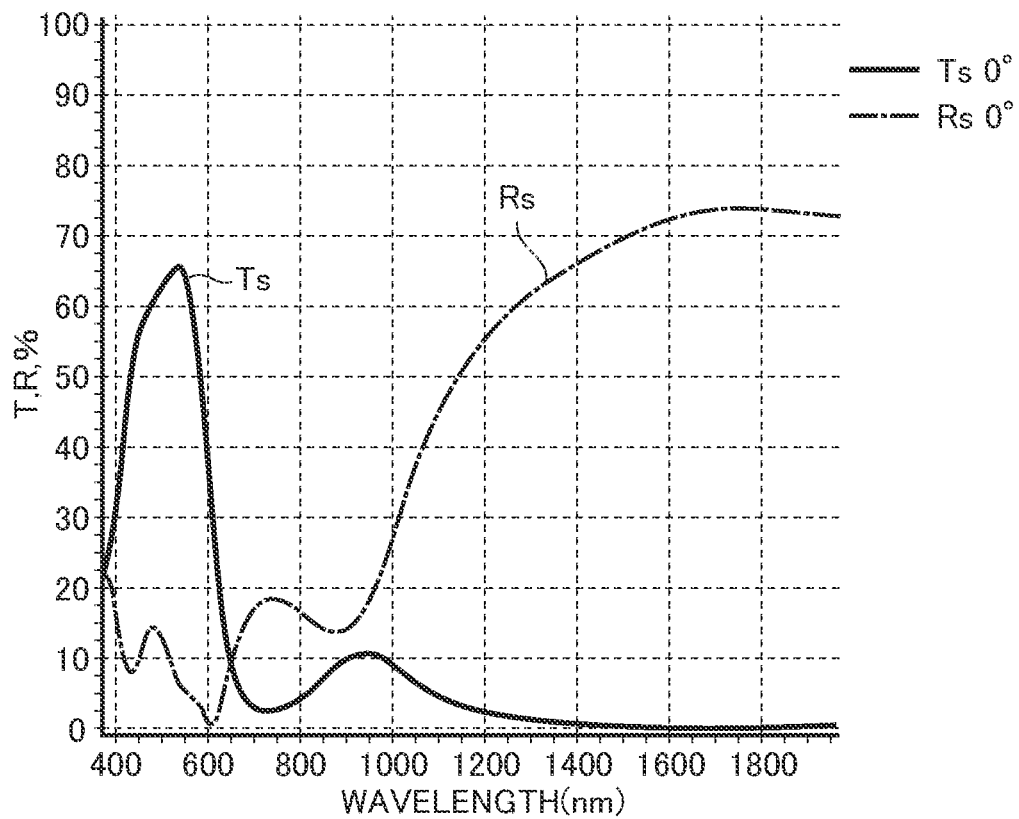
FIG. 12 is a graph showing spectro-optical properties (transmittance Ts and reflectance Rs) of the optical film made of a single-layer film according to Example 2.

Then, an oxide film (optical film) which contained Cs and W and had the optical constants (refractive index and extinction coefficient) as shown in FIG. 11 was formed with a thickness of 200 nm on a soda-lime glass to obtain Substrate: a soda-lime glass First layer: an oxide film containing Cs and W and having a thickness of 200 nm Medium: air. The spectro-optical properties (transmittance Ts and reflectance Rs) were as shown in FIG. 12.

Note that the refractive index n and the extinction coefficient k at each of wavelengths [300 nm, 350 nm, 400 nm, 450 nm, . . . , 1700 nm] specified at 50 nm intervals in a wavelength region from 300 nm to 1700 nm as described in Table 6 given below were obtained from a wavelength dispersion graph of optical constants (refractive index and extinction coefficient) of FIG. 11.

TABLE 6

| Wavelength (nm) | Refractive Index | Extinction Coefficient |
|---|---|---|
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.0 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9 |

Then, it was confirmed that the optical film according to Example 2, which was made of a single-layer film having a film thickness of 200 nm, had transmissivity in a visible wavelength band (the transmittance at a wavelength of 550 nm was 60% or more), had absorbance in a near-infrared wavelength band (the transmittance at a wavelength of 1200 nm was 10% or less), and also had radio wave transparency (sheet resistance: $10^6$ Ω/□).

Example 3

An optical film made of the following multi-layer film was formed.

Figure 9:
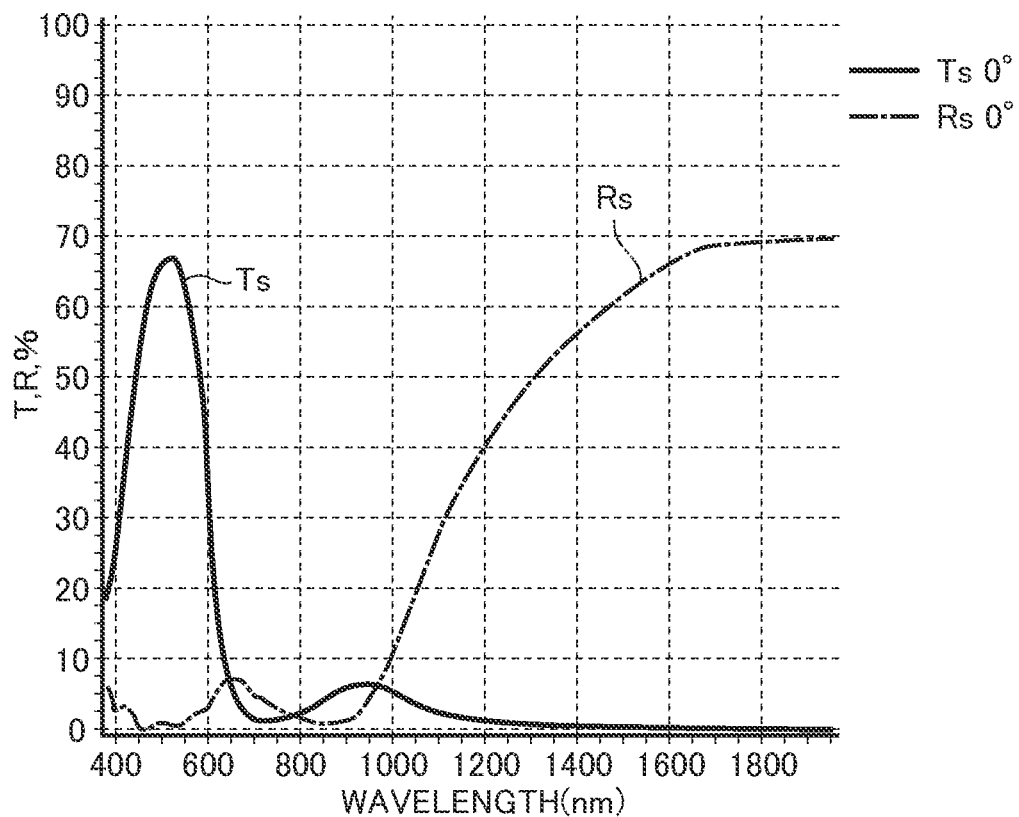
FIG. 9 is a graph showing spectro-optical properties (transmittance Ts and reflectance Rs) of an optical film made of a multi-layer film according to Example 3.

Substrate: a soda-lime glass
First layer: $SiO_2$ having a thickness of 25 nm
Second layer: an oxide film containing Cs and W and having a thickness of 24 nm
Third layer: $SiO_2$ having a thickness of 10 nm
Fourth layer: an oxide film containing Cs and W and having a thickness of 228 nm
Fifth layer: $SiO_2$ having a thickness of 85 nm
Medium: air The spectro-optical properties (transmittance Ts and reflectance Rs) of the above optical film are shown in FIG. 9. It was confirmed that the reflectance in a visible wavelength band was reduced. The film configuration of the multi-layer film may be slightly modified by adjusting the number of film layers and the film thickness of each layer in accordance with the spectro-optical properties to be achieved.

Note that the oxide film containing Cs and W and having the optical constants (refractive index and extinction coefficient) shown in FIG. 11 was formed with a thickness of 24 nm on the first layer of $SiO_2$ film, and the oxide film containing Cs and W and having the optical constants (refractive index and extinction coefficient) shown in FIG. 11 was formed with a thickness of 228 nm on the third layer of $SiO_2$ film.

In addition, $SiO_2$ films were formed by reactive sputtering based on the dual magnetron sputtering using a SiC rotary target.

The method of forming the five-layer film according to Example 3 will be described below. This time, one-pass film formation but not reciprocating film formation was conducted (the five-layer film was formed through one pass). In order to achieve this, it is necessary to arrange a sputtering film formation unit group that is capable of forming a five-layer film through one pass.

A pair of dual magnetron cathode units each including a pair of two SiC rotary targets for the first layer of $SiO_2$ having a thickness of 25 nm, a pair of dual magnetron cathode units each including a pair of two rotary targets using a $Cs_2O$ powder and a $WO_3$ powder and prepared such that the ratio between cesium atoms contained in $Cs_2O$ and tungsten atoms contained in $WO_3$ in the mixture was 1:3 for the second layer of the oxide film containing Cs and W and having a thickness of 24 nm, a pair of dual magnetron cathode units each including a pair of two SiC rotary targets for the third layer of $SiO_2$ having a thickness of 10 nm, two pairs of dual magnetron cathode units each including a pair of two rotary targets using a $Cs_2O$ powder and a $WO_3$ powder and prepared such that the ratio between cesium atoms contained in $Cs_2O$ and tungsten atoms contained in $WO_3$ in the mixture was 1:3 for the fourth layer of the oxide film containing Cs and W and having a thickness of 228 nm, and a pair of dual magnetron cathode units each including a pair of two SiC rotary targets for the fifth layer of $SiO_2$ having a thickness of 85 nm
are arranged.

A 40 kHz mid-frequency sputtering power supply of 50 kW was connected to the rotary magnetron cathode to which each rotary target was attached.

Inside the dual magnetron cathode units, oxygen, which was a reactive gas, was introduced in addition to argon, which was a sputtering gas. The amount of oxygen introduced was feedback-controlled with a piezo valve by measuring the impedance of the sputtering power supply such that the impedance became a set impedance. Note that control using a plasma emission monitor (PEM) in which a specific plasma emission wavelength intensity is measured for feedback control can be applied in place of the impedance control.

First, the film formation chamber and the substrate storage chamber were vacuum-exhausted to $5 \times 10^{-4}$ Pa or less, and then, an argon gas which was able to be mixed with oxygen was introduced at 800 sccm into the dual magnetron cathode units. The heater was adjusted such that the temperature of the glass substrate became 500° C. in the substrate storage chamber and the film formation chamber. As the heater, a near-infrared heater, a carbon heater, a sheath heater, or the like can be used. In addition, it is desirable to arrange a pre-treatment chamber in the substrate storage chamber and the film formation chamber to treat (clean or etch) the surface of the glass substrate using plasma, an ion beam, or the like in the pre-treatment chamber.

The optical film made of the above multi-layer film was formed by applying 12.5 kW to the one pair of rotary magnetron cathodes for the first layer, 9.6 kW to the one pair of rotary magnetron cathodes for the second layer, 10 kW to the one pair of rotary magnetron cathodes for the third layer, 45.6 kW to each of the two pairs of rotary magnetron cathodes for the fourth layer, and 42.5 kW to the one pair of rotary magnetron cathodes for the fifth layer. The optical film thus formed had spectro-optical properties (transmittance Ts and reflectance Rs) as shown in FIG. 9.

Then, it was confirmed that the optical film made of the multi-layer film according to Example 3 had transmissivity in a visible wavelength band (the transmittance at a wavelength of 550 nm was 60% or more), had absorbance in a near-infrared wavelength band (the transmittance at a wavelength of 1200 nm was 10% or less), and also had radio wave transparency (note that since the outermost surface layer of the optical film according to Example 3 was made of insulating $SiO_2$ film, the sheet resistance value was not obtained).

INDUSTRIAL APPLICABILITY

Since the optical film according to the present invention has transmissivity in a visible wavelength band, has absorbance in a near-infrared wavelength band, and also has radio wave transparency, the optical film has industrial applicability for use in vehicle window glasses and the like to reduce the amount of energy consumed by air conditioners in summer.

REFERENCE SIGNS LIST 1 backing tube
2 cylindrical target (rotary target)
10 substrate 11, 12, 13, 14 rotary target
20, 22 connection chamber
21 film formation chamber
23 substrate (glass substrate)
24 transfer roller
25, 26, 27, 28 rotary target
29, 30, 31, 32 sputtering regions
33, 34 dual magnetron cathode unit
60, 68 substrate storage chamber
62, 64, 66 sputtering film formation unit
61, 63, 65, 67 connection chamber
111, 112, 113, 114 target
120, 122 connection chamber
121 film formation chamber
124 transfer roller
125, 126, 127, 128 rotary target
129, 130, 131, 132 sputtering regions
133, 134 dual magnetron cathode unit
140, 142 connection chamber
141 film formation chamber
144 transfer roller
145, 146, 147, 148 rotary target
149, 150, 151, 152 sputtering regions
153, 154 dual magnetron cathode unit

The invention claimed is:

1. An optical film having transmissivity in a visible wavelength band, having absorbance in a near-infrared wavelength band, and having radio wave transparency, characterized in that the optical film comprises cesium, tungsten, and oxygen, and
a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of a TABLE, as set forth below:

TABLE

| Wavelength (nm) | Refractive Index | Extinction Coefficient |
| --- | --- | --- |
| 300 | 7.7 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.8 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9. |

2. The optical film according to claim 1, characterized in that the optical film comprises:
a compound of cesium, tungsten, and oxygen.

3. A sputtering target used to form the optical film according to claim 2 by a sputtering method, characterized in that the sputtering target comprises:
a mixture of a compound of a cesium source and a compound of a tungsten source.

4. The sputtering target according to claim 3, characterized in that
a ratio between cesium atoms and tungsten atoms (Cs:W) is 1:2 to 1:4.

5. The sputtering target according to claim 3, characterized in that the sputtering target comprises:
a thermally sprayed film of the mixture of the compound of the cesium source and the compound of the tungsten source.

6. The sputtering target according to claim 3, characterized in that
the compound of the cesium source is an oxide or a carbonate of cesium.

7. The sputtering target according to claim 3, characterized in that
the compound of the tungsten source is an oxide or a carbide of tungsten.

8. The sputtering target according to claim 3, characterized in that
the sputtering target is a cylindrical rotary target.

9. A method of producing an optical film having transmissivity in a visible wavelength band, having absorbance in a near-infrared wavelength band, and having radio wave transparency, the optical film comprising cesium, tungsten, and oxygen, in which a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of the TABLE, characterized in that the method comprises:
forming the optical film by a sputtering method using the sputtering target according to claim 3 and feedback-controlling an oxygen partial pressure of a sputtering film formation atmosphere.

10. The method of producing the optical firm according to claim 9, characterized in that
the feedback control of the oxygen partial pressure is performed using an impedance controller which feedback-controls an impedance change during film formation.

11. The method of producing the optical film according to claim 9, characterized in that
the feedback control of the oxygen partial pressure is performed using a plasma emission monitor which feedback-controls the oxygen partial pressure by measuring an emission intensity at a specific wavelength during film formation.

12. A method of producing an optical film having transmissivity in a visible wavelength band, having absorbance in a near-infrared wavelength band, and having radio wave transparency, the optical film comprising cesium, tungsten, and oxygen, in which a refractive index n and an extinction coefficient k of the optical film at each of wavelengths [300 nm, 350 nm, 400 nm, 450 nm, . . . , 1700 nm] specified at 50 nm intervals in a wavelength region from 300 nm to 1700 nm are set respectively within numerical ranges of a TABLE, as set forth below, characterized in that the method comprises:

forming the optical film by a dual-sputtering method using a sputtering target of a cesium source and a sputtering target of a tungsten source and feedback-controlling an oxygen partial pressure of a dual-sputtering film formation atmosphere

TABLE

| Wavelength (nm) | Refractive Index | Extinction Coefficient |
|---|---|---|
| 300 | 2.2 to 3.2 | 0.6 to 1.6 |
| 350 | 2.1 to 3.1 | 0.0 to 0.8 |
| 400 | 1.8 to 2.8 | 0.0 to 0.6 |
| 450 | 1.6 to 2.6 | 0.0 to 0.6 |
| 500 | 1.4 to 2.4 | 0.0 to 0.6 |
| 550 | 1.1 to 2.1 | 0.0 to 0.6 |
| 600 | 0.8 to 1.8 | 0.0 to 0.7 |
| 650 | 0.6 to 1.6 | 0.1 to 1.1 |
| 700 | 0.7 to 1.7 | 0.5 to 1.5 |
| 750 | 0.9 to 1.9 | 0.6 to 1.6 |
| 800 | 1.1 to 2.1 | 0.5 to 1.5 |
| 850 | 1.0 to 2.0 | 0.4 to 1.4 |
| 900 | 0.8 to 1.8 | 0.4 to 1.4 |
| 950 | 0.6 to 1.6 | 0.4 to 1.4 |
| 1000 | 0.4 to 1.4 | 0.6 to 1.6 |
| 1050 | 0.3 to 1.3 | 0.8 to 1.8 |
| 1100 | 0.3 to 1.3 | 1.1 to 2.1 |
| 1150 | 0.2 to 1.2 | 1.3 to 2.3 |
| 1200 | 0.3 to 1.3 | 1.4 to 2.4 |
| 1250 | 0.3 to 1.3 | 1.6 to 2.6 |
| 1300 | 0.3 to 1.3 | 1.8 to 2.8 |
| 1350 | 0.3 to 1.3 | 1.9 to 2.9 |
| 1400 | 0.3 to 1.3 | 2.1 to 3.1 |
| 1450 | 0.3 to 1.3 | 2.2 to 3.2 |

TABLE-continued

| Wavelength (nm) | Refractive Index | Extinction Coefficient |
|---|---|---|
| 1500 | 0.3 to 1.3 | 2.4 to 3.4 |
| 1550 | 0.4 to 1.4 | 2.5 to 3.5 |
| 1600 | 0.4 to 1.4 | 2.6 to 3.6 |
| 1650 | 0.4 to 1.4 | 2.8 to 3.8 |
| 1700 | 0.5 to 1.5 | 2.9 to 3.9. |

13. The method of producing the optical film according to claim 12, characterized in that the method comprises:
   adjusting an electric power to be applied to a sputtering cathode or a duty ratio such that a ratio between cesium atoms and tungsten atoms (Cs:W) contained in the optical film is 1:2 to 1:4.

14. The method of producing the optical film according to claim 12, characterized in that
   the feedback control of the oxygen partial pressure is performed using an impedance controller which feedback-controls an impedance change during film formation.

15. The method of producing the optical film according to claim 12, characterized in that
   the feedback control of the oxygen partial pressure is performed using a plasma emission monitor which feedback-controls the oxygen partial pressure by measuring an emission intensity at a specific wavelength during film formation.

* * * * *

UNITED STATES PATENT AND TRADEMARK OFFICE
CERTIFICATE OF CORRECTION

| | | |
|---|---|---|
| PATENT NO. | : 12,297,528 B2 | Page 1 of 1 |
| APPLICATION NO. | : 17/635337 | |
| DATED | : May 13, 2025 | |
| INVENTOR(S) | : Hideharu Okami | |

It is certified that error appears in the above-identified patent and that said Letters Patent is hereby corrected as shown below:

In the Claims

Column 21, Claim 1, first Line of the "TABLE," currently reads:
300   7.7 to 3.2   06. to 1.6
It should read:
300   2.2 to 3.2   06. to 1.6

Signed and Sealed this
Fifteenth Day of July, 2025

Coke Morgan Stewart
*Acting Director of the United States Patent and Trademark Office*